US012622206B2

(12) United States Patent
Motoda et al.

(10) Patent No.: US 12,622,206 B2
(45) Date of Patent: May 5, 2026

(54) SUBSTRATE PROCESSING APPARATUS AND SUBSTRATE PROCESSING METHOD

(71) Applicant: Tokyo Electron Limited, Tokyo (JP)

(72) Inventors: Kimio Motoda, Koshi (JP); Norifumi Kohama, Koshi (JP); Norio Wada, Koshi (JP); Yosuke Omori, Koshi (JP); Kenji Sugakawa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 733 days.

(21) Appl. No.: 17/933,983

(22) Filed: Sep. 21, 2022

(65) Prior Publication Data

US 2023/0014665 A1      Jan. 19, 2023

Related U.S. Application Data

(63) Continuation of application No. 16/964,008, filed as application No. PCT/JP2019/000623 on Jan. 11, 2019, now Pat. No. 11,482,431.

(30) Foreign Application Priority Data

Jan. 23, 2018    (JP) ................................. 2018-008891

(51) Int. Cl.
  B32B 43/00        (2006.01)
  H10P 72/00        (2026.01)
      (Continued)

(52) U.S. Cl.
  CPC .......... H10P 72/0428 (2026.01); H10P 72/50 (2026.01); H10P 72/76 (2026.01);
      (Continued)

(58) Field of Classification Search
  CPC ............. B32B 43/006; Y10T 156/1132; Y10T 156/1944
  See application file for complete search history.

(56) References Cited

U.S. PATENT DOCUMENTS 4,721,462 A * 1/1988 Collins, Jr. ............... F27D 5/00
                                                          269/21
5,564,682 A * 10/1996 Tsuji ................... H01L 21/6838
                                                          269/21
(Continued)

FOREIGN PATENT DOCUMENTS

JP        H09-283392 A    10/1997
JP        2005-116842 A    4/2005
          (Continued)

OTHER PUBLICATIONS

International Search Report for PCT/JP2019/000623 dated Feb. 26, 2019.

*Primary Examiner* — Philip C Tucker
*Assistant Examiner* — Nickolas R Harm
(74) *Attorney, Agent, or Firm* — Chrisman Gallo Tochtrop LLC

(57)         ABSTRACT

A substrate processing apparatus includes a holder having thereon an attraction surface configured to attract a substrate and including an outer attracting member configured to attract a peripheral portion of the substrate and an inner attracting member configured to attract a portion of the substrate inside the peripheral portion of the substrate attracted by the outer attracting member in a diametrical direction of the attraction surface; a moving device configured to move the outer attracting member with respect to the inner attracting member; and a controller configured to control a distortion, which is caused at the substrate attracted to the attraction surface, by controlling a movement of the outer attracting member with respect to the inner attracting member.

6 Claims, 12 Drawing Sheets

(51) Int. Cl.
  *H10P 72/50*   (2026.01)
  *H10P 72/76*   (2026.01)
  *H10P 72/78*   (2026.01)

(52) U.S. Cl.
  CPC ............ *H10P 72/78* (2026.01); *B32B 43/006*
    (2013.01); *Y10T 156/1132* (2015.01); *Y10T*
           *156/1944* (2015.01)

(56)      References Cited

U.S. PATENT DOCUMENTS

| | | | |
|---|---|---|---|
| 7,607,647 B2 * | 10/2009 | Zhao | H01L 21/6838 |
| | | | 269/21 |
| 8,465,011 B2 * | 6/2013 | Segawa | H01L 21/6838 |
| | | | 156/707 |
| 8,613,474 B2 * | 12/2013 | Goodman | H01L 21/68785 |
| | | | 294/64.3 |
| 2007/0135024 A1 | 6/2007 | Kobata et al. | |
| 2008/0145556 A1 | 6/2008 | Nagayama et al. | |
| 2012/0080052 A1 * | 4/2012 | Canale | H01L 21/68735 |
| | | | 269/319 |
| 2013/0025114 A1 | 1/2013 | Mizubata | |
| 2015/0028907 A1 | 1/2015 | Shinohara et al. | |
| 2015/0343755 A1 | 12/2015 | Honda et al. | |

FOREIGN PATENT DOCUMENTS

| | | |
|---|---|---|
| JP | 2014-103409 A | 6/2014 |
| JP | 2015-095579 A | 5/2015 |
| JP | 2016-039364 A | 3/2016 |
| KR | 10-2015-0139436 A | 12/2015 |
| TW | 201616609 A | 5/2016 |

* cited by examiner

SUBSTRATE PROCESSING APPARATUS AND SUBSTRATE PROCESSING METHOD

CROSS-REFERENCE TO RELATED APPLICATION

This is a continuation application of U.S. patent application Ser. No. 16/964,008, filed on Jul. 22, 2020, which is a U.S. national phase application under 35 U.S.C. § 371 of PCT Application No. PCT/JP2019/000623 filed on Jan. 11, 2019, which claims the benefit of Japanese Patent Application No. 2018-008891 filed on Jan. 23, 2018, the entire disclosures of which are incorporated herein by reference.

TECHNICAL FIELD

The various aspects and embodiments described herein pertain generally to a substrate processing apparatus and a substrate processing method.

BACKGROUND

A bonding apparatus described in Patent Document 1 is equipped with an upper chuck configured to attract a substrate at an upper side from above it and a lower chuck configured to attract a substrate at a lower side from below it. While being held to face each other, the two substrates are bonded. To elaborate, the bonding apparatus brings a central portion of the upper substrate attracted by the upper chuck into contact with a central portion of the lower substrate attracted by the lower chuck by pressing down the central portion of the upper substrate. Accordingly, the central portions of the two substrates are bonded by an intermolecular force or the like. Then, the bonding apparatus expands a bonding region between the two substrates from the central portions of the substrates to peripheral portions thereof.

Patent Document 1: Japanese Patent Laid-open Publication No. 2015-095579

SUMMARY

In an exemplary embodiment, a substrate processing apparatus includes a holder having thereon an attraction surface configured to attract a substrate and including an outer attracting member configured to attract a peripheral portion of the substrate and an inner attracting member configured to attract a portion of the substrate inside the peripheral portion of the substrate attracted by the outer attracting member in a diametrical direction of the attraction surface; a moving device configured to move the outer attracting member with respect to the inner attracting member; and a controller configured to control a distortion, which is caused at the substrate attracted to the attraction surface, by controlling a movement of the outer attracting member with respect to the inner attracting member.

DETAILED DESCRIPTION

Figure 1:
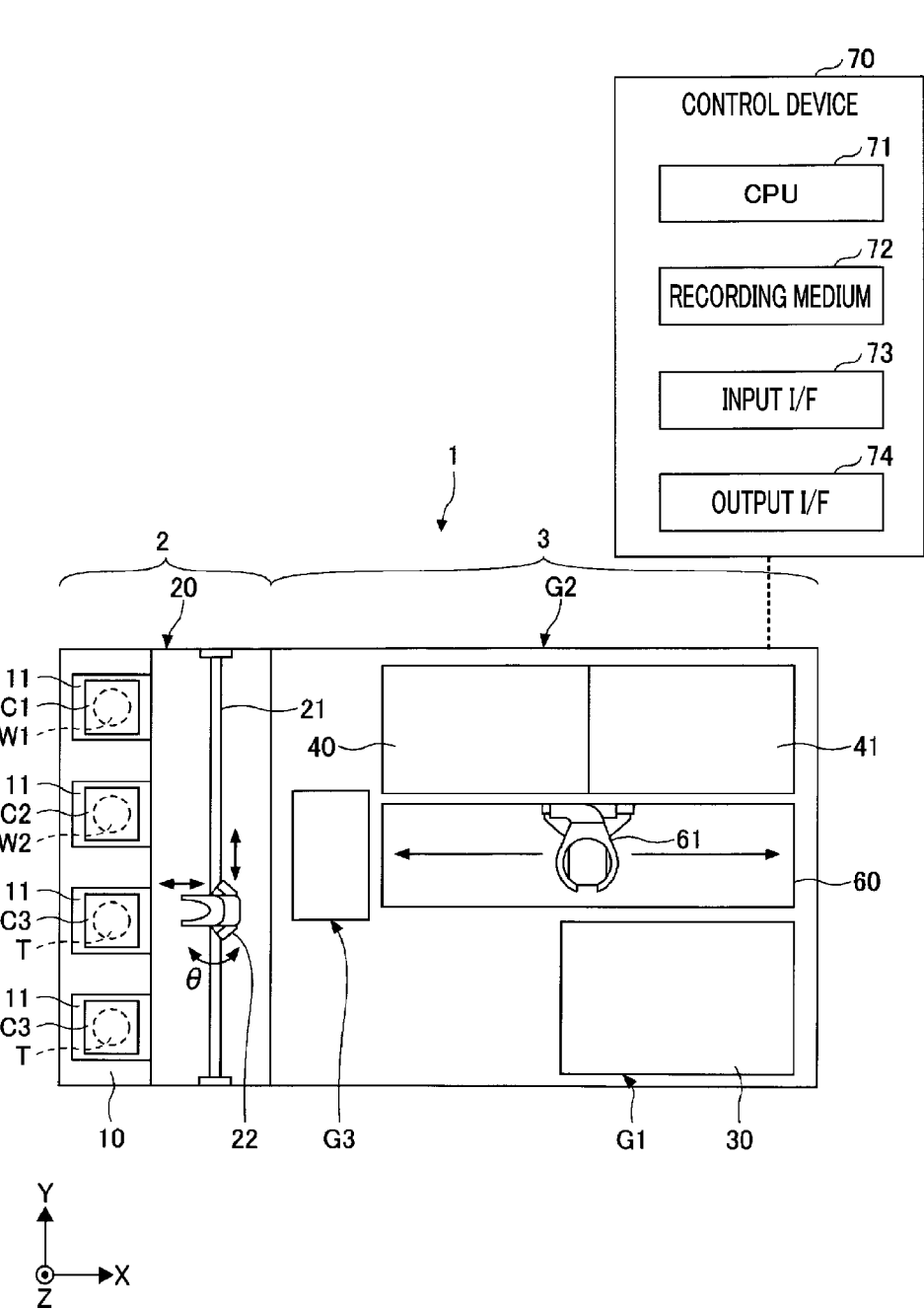
FIG. 1 is a plan view illustrating a bonding system according to an exemplary embodiment.

Hereinafter, exemplary embodiments of the present disclosure will be described in detail with reference to the accompanying drawings. In the various drawings, same or corresponding parts will be assigned same reference numerals, and redundant description may be omitted. In the following description, the X-axis direction, the Y-axis direction and the Z-axis direction are orthogonal to each other, and the X-axis and Y-axis directions are horizontal directions whereas the Z-axis direction is a vertical direction. A rotational direction around a vertical axis is also referred to as "θ direction." In the present specification, below means vertically below, and above means vertically above.

<Bonding System>

Figure 2:
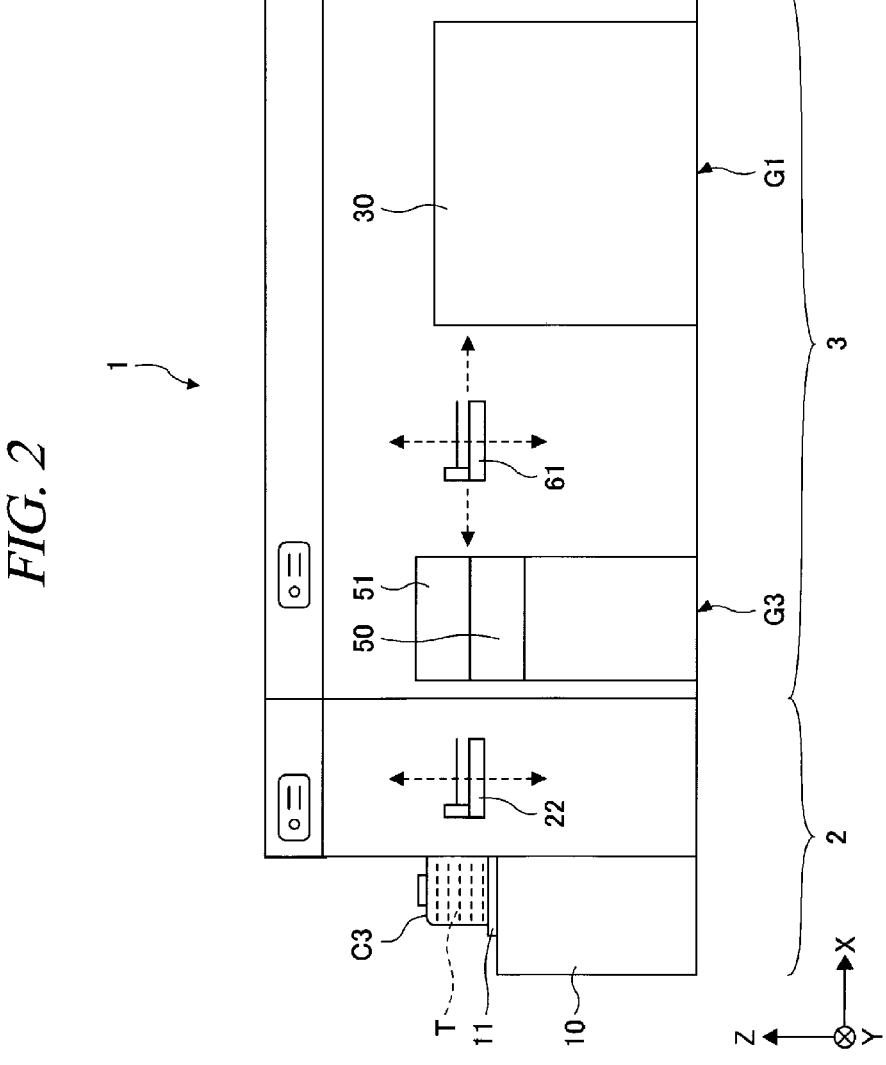
FIG. 2 is a side view illustrating the bonding system according to the exemplary embodiment.
Figure 3:
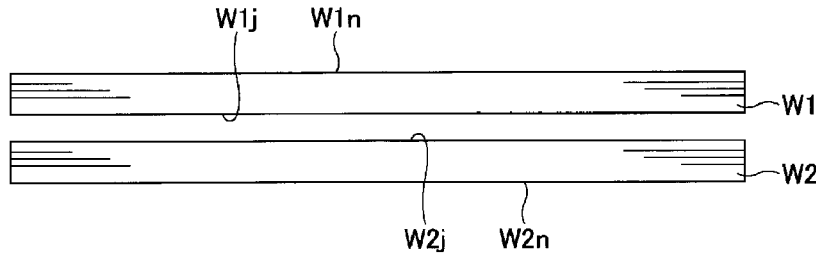
FIG. 3 is a side view illustrating a state before a first substrate and a second substrate are bonded according to the exemplary embodiment.

FIG. 1 is a plan view illustrating a bonding system 1 according to an exemplary embodiment. FIG. 2 is a side view illustrating the bonding system 1 according to the exemplary embodiment. FIG. 3 is a side view illustrating a state before a first substrate and a second substrate are bonded according to the exemplary embodiment. The bonding system 1 shown in FIG. 1 forms a combined substrate T (see FIG. 7B) by bonding a first substrate W1 and a second substrate W2.

The first substrate W1 is, for example, a semiconductor substrate such as a silicon wafer or a compound semiconductor wafer on which multiple electronic circuits are formed. The second substrate W2 is, for example, a bare wafer on which no electronic circuit is formed. The first substrate W1 and the second substrate W2 have the substantially same diameter. Further, the second substrate W2 may have an electronic circuit formed thereon.

In the following description, the first substrate W1 may sometimes be referred to as "upper wafer W1"; the second substrate W2, "lower wafer W2"; and the combined substrate T, "combined wafer T." Further, in the following description, as depicted in FIG. 3, among surfaces of the upper wafer W1, a surface to be bonded to the lower wafer W2 will be referred to as "bonding surface W1j", and a surface opposite to the bonding surface W1j will be referred to as "non-bonding surface W1n". Further, among surfaces of the lower wafer W2, a surface to be bonded to the upper wafer W1 will be referred to as "bonding surface W2j", and a surface opposite to the bonding surface W2j will be referred to as "non-bonding surface W2n."

As depicted in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a multiple number of placing plates 11. Provided on the placing plates 11 are cassettes C1, C2 and C3 each of which accommodates therein a plurality of (e.g., 25 sheets of) substrates horizontally. For example, the cassette C1 accommodates therein upper wafers W1; the cassette C2, lower wafers W2; and the cassettes C3, combined wafers T.

The transfer section 20 is provided adjacent to the positive X-axis side of the placing table 10. Provided in the transfer section 20 are a transfer path 21 extending in the Y-axis direction and a transfer device 22 configured to be movable along the transfer path 21. The transfer device 22 is configured to be movable in the X-axis direction as well as in the Y-axis direction and pivotable around the Z-axis. Further, the transfer device 22 is also configured to transfer the upper wafers W1, the lower wafers W2 and the combined wafers T between the cassettes C1 to C3 placed on the placing plates 11 and a third processing block G3 of the processing station 3 to be described later.

Further, the number of the cassettes C1 to C3 placed on the placing plates 11 is not limited to the shown example. In addition, besides the cassettes C1 to C3, a cassette for collecting a problematic substrate or the like may be additionally provided on the placing plates 11.

A multiple number of, for example, three processing blocks G1, G2 and G3 equipped with various kinds of devices are provided in the processing station 3. For example, the first processing block G1 is provided at a front side (negative Y-axis side of FIG. 1) of the processing station 3, and the second processing block G2 is provided at a rear side (positive Y-axis side of FIG. 1) of the processing station 3. Further, the third processing block G3 is provided at a side of the carry-in/out station 2 (negative X-axis side of FIG. 1) of the processing station 3.

Provided in the first processing block G1 is a surface modifying apparatus 30 configured to modify the bonding surface W1j of the upper wafer W1 and the bonding surface W2j of the lower wafer W2. In the surface modifying apparatus 30, a SiO$_2$ bond on the bonding surfaces W1j and W2j of the upper wafer W1 and the lower wafer W2 is cut to be turned into SiO of a single bond, so that the bonding surfaces W1j and W2j are modified such that these surfaces are easily hydrophilized afterwards.

Furthermore, in the surface modifying apparatus 30, for example, an oxygen gas or a nitrogen gas as a processing gas is excited into plasma under a decompressed atmosphere to be ionized. As these oxygen ions or nitrogen ions are irradiated to the bonding surfaces W1j and W2j of the upper wafer W1 and the lower wafer W2, the bonding surfaces W1j and W2j are plasma-processed to be modified.

In the second processing block G2, a surface hydrophilizing apparatus 40 and a bonding apparatus 41 are disposed. The surface hydrophilizing apparatus 40 is configured to hydrophilize and clean the bonding surfaces W1j and W2j of the upper wafer W1 and the lower wafer W2 with, for example, pure water. In this surface hydrophilizing apparatus 40, while rotating the upper wafer W1 or the lower wafer W2 held by, for example, a spin chuck, the pure water is supplied onto the upper wafer W1 or the lower wafer W2. Accordingly, the pure water supplied onto the upper wafer W1 or the lower wafer W2 is diffused onto the bonding surface W1j of the upper wafer W1 or the bonding surface W2j of the lower wafer W2, so that the bonding surfaces W1j and W2j are hydrophilized.

The bonding apparatus 41 is configured to bond the upper wafer W1 and the lower wafer W2, which are hydrophilized, by an intermolecular force. A configuration of the bonding apparatus 41 will be discussed later.

In the third processing block G3, as shown in FIG. 2, transition (TRS) devices 50 and 51 for the upper wafer W1, the lower wafer W2 and the combined wafer T are provided in two levels in this order from below.

Further, as illustrated in FIG. 1, a transfer section 60 is formed in a region surrounded by the first processing block G1, the second processing block G2 and the third processing block G3. A transfer device 61 is provided in the transfer section 60. The transfer device 61 is equipped with, for example, a transfer arm which is configured to be movable in a vertical direction and a horizontal direction and pivotable around a vertical axis. The transfer device 61 is moved within the transfer section 60 and transfers the upper wafers W1, the lower wafers W2 and the combined wafers T with respect to preset devices within the first processing block G1, the second processing block G2 and the third processing block G3 which are adjacent to the transfer section 60.

Furthermore, as depicted in FIG. 1, the bonding system 1 includes a control device 70. The control device 70 controls an operation of the bonding system 1. The control device 70 may be implemented by, for example, a computer and includes, as illustrated in FIG. 1, a CPU (Central Processing Unit) 71, a recording medium 72 such as a memory, an input interface 73 and an output interface 74. The control device 70 carries out various kinds of controls by allowing the CPU 71 to execute a program stored in the recording medium 72. Further, the control device 70 receives a signal from an outside through the input interface 73 and transmits a signal to the outside through the output interface 74.

The program of the control device 70 is recorded in an information recording medium and installed from the information recording medium. The information recording medium may be, by way of non-limiting example, a hard disc (HD), a flexible disc (FD), a compact disc (CD), a magnet optical disc (MO), or a memory card. Further, the program may be installed by being downloaded from a server through Internet.

<Bonding Apparatus>

Figure 4:
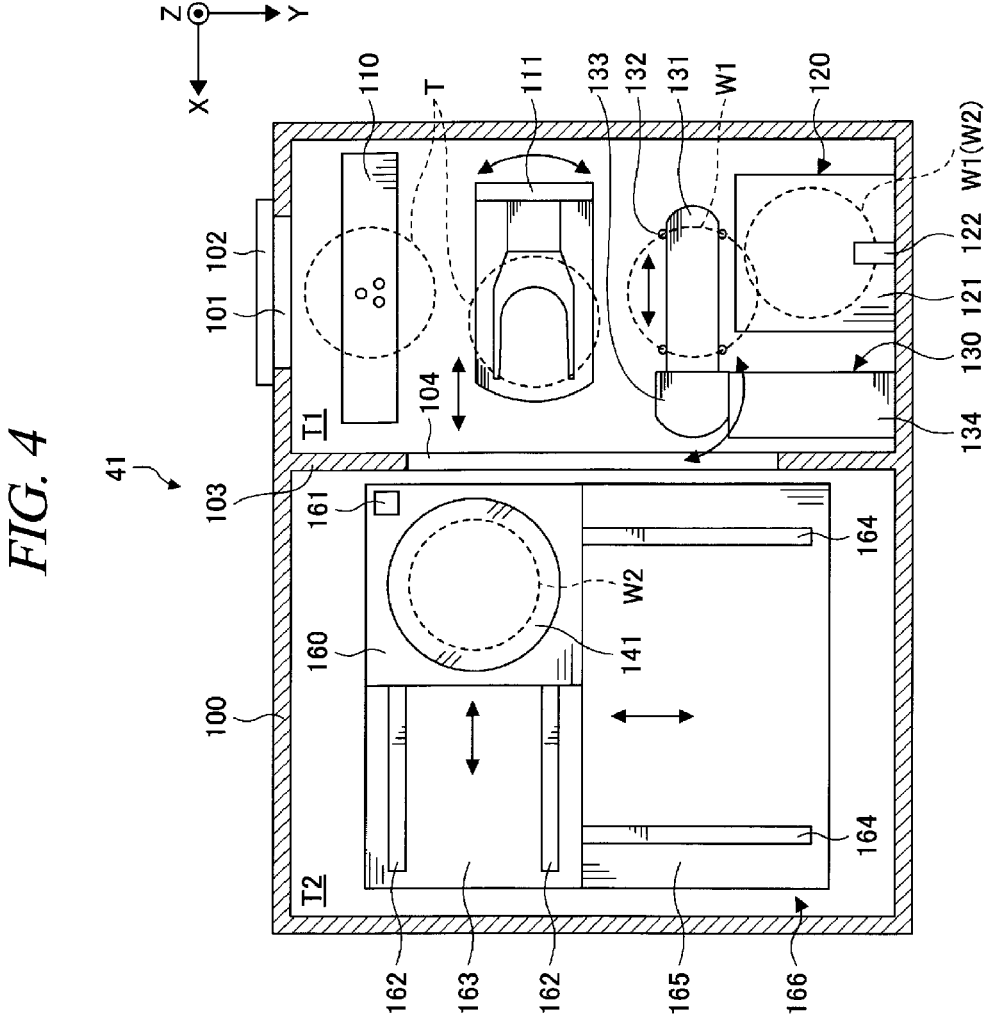
FIG. 4 is a plan view illustrating a bonding apparatus according to the exemplary embodiment.
Figure 5:
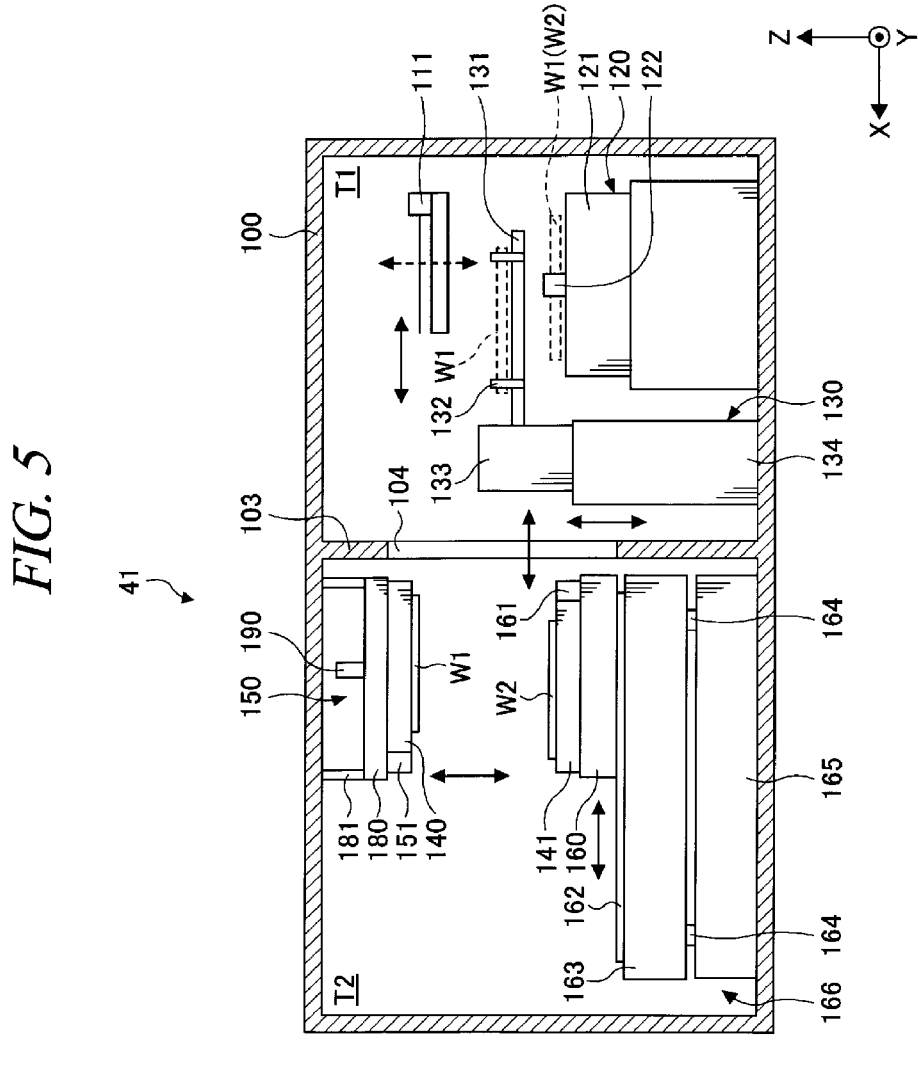
FIG. 5 is a side view illustrating the bonding apparatus according to the exemplary embodiment.

FIG. 4 is a plan view illustrating the bonding apparatus 41 according to the exemplary embodiment. FIG. 5 is a side view illustrating the bonding apparatus 41 according to the exemplary embodiment.

As depicted in FIG. 4, the bonding apparatus 41 includes a processing vessel 100 having a hermetically sealable inside. A carry-in/out opening 101 for the upper wafer W1, the lower wafer W2 and the combined wafer T is formed on a lateral side of the processing vessel 100 at a side of the transfer section 60. A shutter 102 for opening/closing the carry-in/out opening 101 is provided at the carry-in/out opening 101.

The inside of the processing vessel 100 is partitioned into a transfer region T1 and a processing region T2 by an inner wall 103. The aforementioned carry-in/out opening 101 is formed at a side surface of the processing vessel 100 in the transfer region T1. Further, a carry-in/out opening 104 for the upper wafer W1, the lower wafer W2 and the combined wafer T is formed at the inner wall 103.

In the transfer region T1, a transition 110, a wafer transfer device 111, an inverting device 130 and a position adjusting device 120 are arranged side by side in this sequence from, for example, a carry-in/out opening 101 side.

The transition 110 is configured to temporarily place thereon the upper wafer W1, the lower wafer W2 and the combined wafer T. The transition 110 has, for example, two levels, and is capable of holding any two of the upper wafer W1, the lower wafer W2 and the combined wafer T.

The wafer transfer device 111 is equipped with a transfer arm configured to be movable in the vertical direction (Z-axis direction) and the horizontal directions (Y-axis direction and X-axis direction) and also pivotable around a vertical axis, as shown in FIG. 4 and FIG. 5. The wafer transfer device 111 is capable of transferring the upper wafer W1, the lower wafer W2 and the combined wafer T within the transfer region T1 or between the transfer region T1 and the processing region T2.

The position adjusting device 120 is configured to adjust a direction of the upper wafer W1 (lower wafer W2) in the horizontal direction. To elaborate, the position adjusting device 120 includes a base 121 equipped with a non-illustrated holder configured to hold and rotate the upper wafer W1 (lower wafer W2); and a detector 122 configured to detect a position of a notch of the upper wafer W1 (lower wafer W2). The position adjusting device 120 adjusts the position of the notch of the upper wafer W1 (lower wafer W2) by detecting the position of the notch with the detector 122 while rotating the upper wafer W1 (lower wafer W2) held by the base 121. Accordingly, the position of the upper wafer W1 (lower wafer W2) in the horizontal direction is adjusted.

The inverting device 130 is configured to invert a front surface and a rear surface of the upper wafer W1. To elaborate, the inverting device 130 is equipped with a holding arm 131 configured to hold the upper wafer W1. The holding arm 131 extends in the horizontal direction (X-axis direction). Further, the holding arm 131 is provided with, at four positions, for example, holding members 132 configured to hold the upper wafer W1.

The holding arm 131 is supported by a driving unit 133 having, for example, a motor or the like. The holding arm 131 is configured to be rotatable around a horizontal axis by the driving unit 133. Further, the holding arm 131 is rotatable around the driving unit 133 and movable in the horizontal direction (X-axis direction). Another driving unit (not shown) including, for example, a motor or the like is provided under the driving unit 133. The driving unit 133 can be moved in the vertical direction along a vertically extending supporting column 134 by this another driving unit.

Further, the upper wafer W1 held by the holding members 132 can be rotated around the horizontal axis by the driving unit 133 and can also be moved in the vertical direction and the horizontal direction. Further, the upper wafer W1 held by the holding members 132 can be moved between the position adjusting device 120 and an upper chuck 140 to be described later by being rotated around the driving unit 133.

Provided within the processing region T2 are the upper chuck 140 configured to attract and hold a top surface (non-bonding surface W1n) of the upper wafer W1 from above and a lower chuck 141 configured to place thereon the lower wafer W and attract and hold a bottom surface (non-bonding surface W2n) of the lower wafer W2 from below. The lower chuck 141 is provided under the upper chuck 140 and configured to be arranged to face the upper chuck 140 in parallel. The upper chuck 140 and the lower chuck 141 are arranged apart from each other in the vertical direction.

As depicted in FIG. 5, the upper chuck 140 is held by an upper chuck holder 150 which is provided above the upper chuck 140. The upper chuck holder 150 is provided at a ceiling surface of the processing vessel 100. The upper chuck 140 is fixed to the processing vessel 100 with the upper chuck holder 150 therebetween.

The upper chuck holder 150 is equipped with an upper imaging device 151 configured to image a top surface (bonding surface W2j) of the lower wafer W2 held by the lower chuck 141. By way of example, a CCD camera is used as the upper imaging device 151.

The lower chuck 141 is supported by a first lower chuck mover 160 provided below the lower chuck 141. The first lower chuck mover 160 moves the lower chuck 141 in the horizontal direction (X-axis direction) as will be described later. Further, the first lower chuck mover 160 is also configured to be capable of moving the lower chuck 141 in the vertical direction and rotate the lower chuck 141 around a vertical axis.

The first lower chuck mover 160 is equipped with a lower imaging device 161 configured to image a bottom surface (bonding surface W1j) of the upper wafer W1 held by the upper chuck 140 (see FIG. 5). The lower imaging device 161 may be, by way of example, a CCD camera.

The first lower chuck mover 160 is fastened to a pair of rails 162 which is provided at a bottom side of the first lower chuck mover 160 and extends in the horizontal direction (X-axis direction). The first lower chuck mover 160 is configured to be movable along the rails 162.

The rails 162 are disposed on a second lower chuck mover 163. The second lower chuck mover 163 is fastened to a pair of rails 164 which is disposed at a bottom side of the second lower chuck mover 163 and extends in the horizontal direction (Y-axis direction). The second lower chuck mover 163 is configured to be movable in the horizontal direction (Y-axis direction) along the rails 164. Further, the rails 164 is disposed on the placing table 165 which is disposed at a bottom of the processing vessel 100.

The first lower chuck mover 160, the second lower chuck mover 163, and so forth constitute a position adjuster 166. The position adjuster 166 is configured to perform position adjustment in the horizontal direction between the upper wafer W1 held by the upper chuck 140 and the lower wafer W2 held by the lower chuck 141 by moving the lower chuck 141 in the X-axis direction, the Y-axis direction and the θ direction. Further, the position adjuster 166 is also configured to perform position adjustment in the vertical direction between the upper wafer W1 held by the upper chuck 140 and the lower wafer W2 held by the lower chuck 141 by moving the lower chuck 141 in the Z-axis direction.

Further, although the position adjuster 166 of the present exemplary embodiment carries out the position adjustment between the upper wafer W1 and the lower wafer W2 in the horizontal direction by moving the lower chuck 141 in the X-axis direction, the Y-axis direction and the θ direction, the present disclosure is not limited thereto. The way how the position adjuster 166 performs this position adjustment in the horizontal direction is not particularly limited as long as the upper chuck 140 and the lower chuck 141 are moved relatively to each other in the X-axis direction, the Y-axis direction and the θ direction. By way of example, the position adjuster 166 may perform the position adjustment in the horizontal direction between the upper wafer W1 and the lower wafer W2 by moving the lower chuck 141 in the X-axis direction and the Y-axis direction and by moving the upper chuck 140 in the θ direction.

Furthermore, although the position adjuster 166 of the present disclosure carries out the position adjustment between the upper wafer W1 and the lower wafer W2 in the vertical direction by moving the lower chuck 141 in the Z-axis direction, the present disclosure is not limited thereto. The way how the position adjuster 166 performs this position adjustment in the vertical direction is not particularly limited as long as the upper chuck 140 and the lower chuck 141 can be moved relatively to each other in the Z-axis direction. By way of example, the position adjuster 166 may perform the position adjustment between the upper wafer W1 and the lower wafer W2 in the vertical direction by moving the upper chuck 140 in the Z-axis direction.

Figure 6:
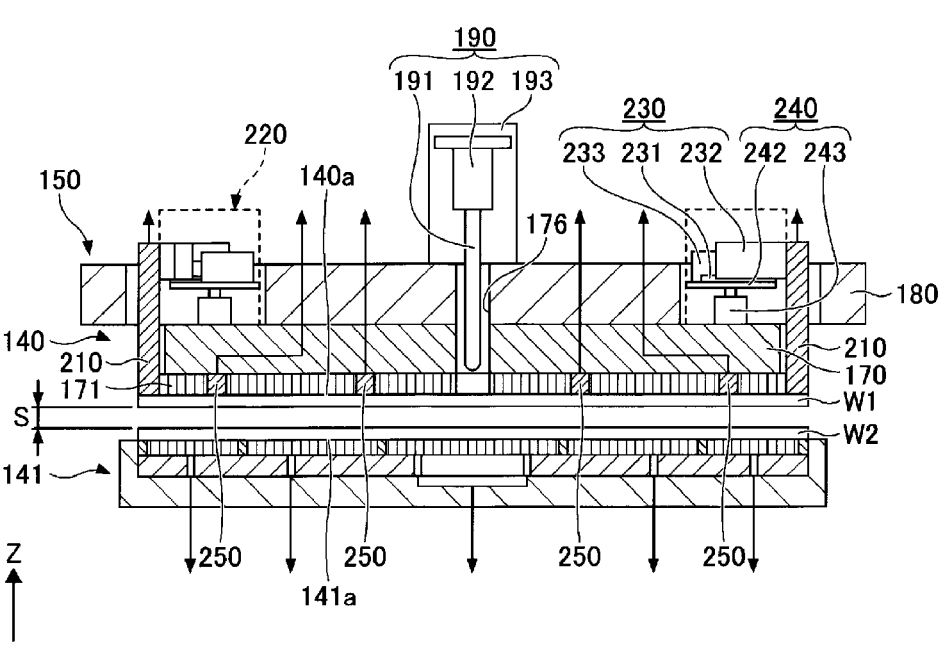
FIG. 6 is a cross sectional view illustrating an upper chuck and a lower chuck according to the exemplary embodiment, showing a state before an upper wafer and a lower wafer are bonded after their positions are adjusted.
Figure 7A:
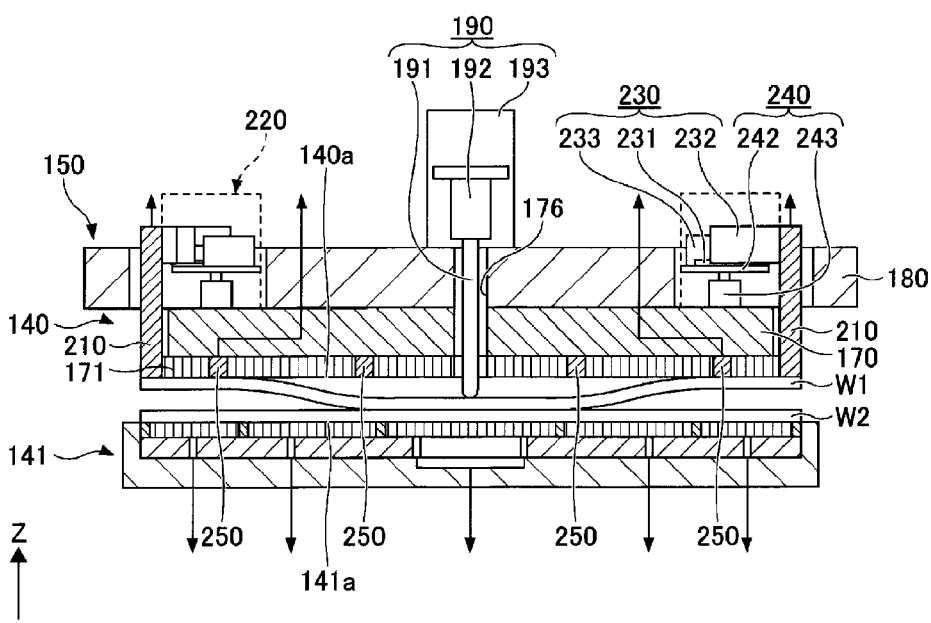
FIG. 7A and FIG. 7B are cross sectional views illustrating an operation through which the upper wafer and the lower wafer are gradually bonded from central portions toward peripheral portions thereof according to the exemplary embodiment.
Figure 7B:
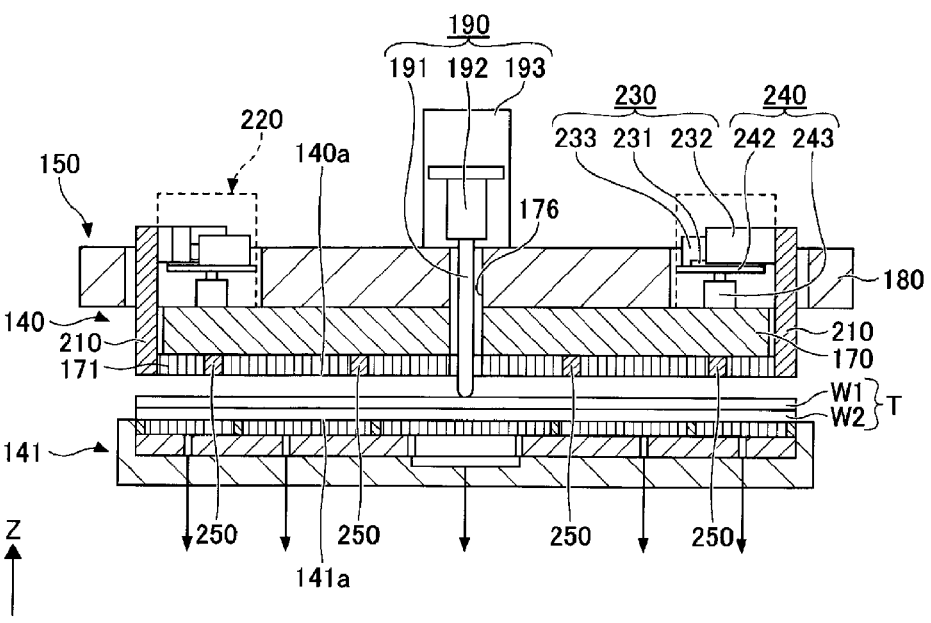

FIG. 6 is a cross sectional view illustrating the upper chuck and the lower chuck according to the exemplary embodiment, showing a state immediately before the upper wafer and the lower wafer are bonded. FIG. 7A is a cross sectional view illustrating a state in the middle of bonding between the upper wafer and the lower wafer according to the present exemplary embodiment. FIG. 7B is a cross sectional view illustrating a state upon the completion of the bonding between the upper wafer and the lower wafer according to the present exemplary embodiment. Solid-lined arrows in FIG. 6, FIG. 7A and FIG. 7B indicate a direction in which air is suctioned by a vacuum pump.

The upper chuck 140 and the lower chuck 141 are, for example, vacuum chucks. The upper chuck 140 corresponds to a holder described in the claims, and the lower chuck 141 corresponds to a facing holder described in the claims. The upper chuck 140 has, at the surface (bottom surface) thereof facing the lower chuck 141, an attraction surface 140a to which the upper wafer W1 is attracted. Meanwhile, the lower chuck 141 has, at the surface (top surface) facing the upper chuck 140, an attraction surface 141a to which the lower wafer W2 is attracted.

The upper chuck 140 has a chuck base 170. The chuck base 170 has a diameter equal to or larger than a diameter of the upper wafer W1. The chuck base 170 is supported by a supporting member 180. The supporting member 180 is disposed to cover at least the chuck base 170 when viewed from the top, and is fixed to the chuck base 170 by, for example, screws. The supporting member 180 is supported by a plurality of supporting columns 181 (see FIG. 5) provided at the ceiling surface of the processing vessel 100. The supporting member 180 and the plurality of supporting columns 181 constitute the upper chuck holder 150.

A through hole 176 is formed through the supporting member 180 and the chuck base 170 in the vertical direction. A position of the through hole 176 corresponds to a central portion of the upper wafer W1 attracted to and held by the upper chuck 140. A push pin 191 of a striker 190 is inserted into this through hole 176.

The striker 190 is provided on a top surface of the supporting member 180 and is equipped with the push pin 191, an actuator unit 192 and a linearly moving mechanism 193. The push pin 191 is a columnar member extending along the vertical direction and is supported by an actuator unit 192.

The actuator unit 192 is configured to generate a constant pressure in a certain direction (here, a vertically downward direction) by air supplied from, for example, an electro-pneumatic regulator (not shown). By the air supplied from the electro-pneumatic regulator, the actuator unit 192 is capable of controlling a press load applied to the central portion of the upper wafer W1 as it is brought into contact with the central portion of the upper wafer W1. Further, a leading end of the push pin 191 is movable up and down in the vertical direction through the through hole 176 by the air from the electro-pneumatic regulator.

The actuator unit 192 is supported at the linearly moving mechanism 193. The linearly moving mechanism 193 moves the actuator unit 192 in the vertical direction by a driving unit including a motor, for example.

The striker 190 is configured as described above, and controls a movement of the actuator unit 192 by the linearly moving mechanism 193 and controls the press load upon the upper wafer W1 from the push pin 191 by the actuator unit 192.

The striker 190 presses the upper wafer W1 attracted to and held by the upper chuck 140 and the lower wafer W2 attracted to and held by the lower chuck 141 to allow the upper wafer W1 and the lower wafer W2 to come into contact with each other. To elaborate, the striker 190 transforms the upper wafer W1 attracted to and held by the upper chuck 140, thus allowing the upper wafer W1 to be pressed in contact with the lower wafer W2.

A plurality of pins 171 is provided on a bottom surface of the chuck base 170, and these pins 171 are in contact with the non-bonding surface Win of the upper wafer W1. The upper chuck 140 is composed of the chuck base 170, the plurality of pins 171, and so forth. The attraction surface 140a of the upper chuck 140 which attracts and holds the upper wafer W1 is divided into multiple regions in a diametrical direction, and generation of an attracting pressure and release of the attracting pressure are performed for divided regions individually.

Further, the lower chuck 141 may be configured the same as the upper chuck 140. The lower chuck 141 has a plurality of pins in contact with the non-bonding surface W2n of the lower wafer W2. The attraction surface 141a of the lower chuck 141 which attracts and holds the lower wafer W2 is divided into multiple regions in the diametrical direction, and generation of an attracting pressure and release of the attracting pressure are performed for divided regions individually.

<Bonding Method>

Figure 8:
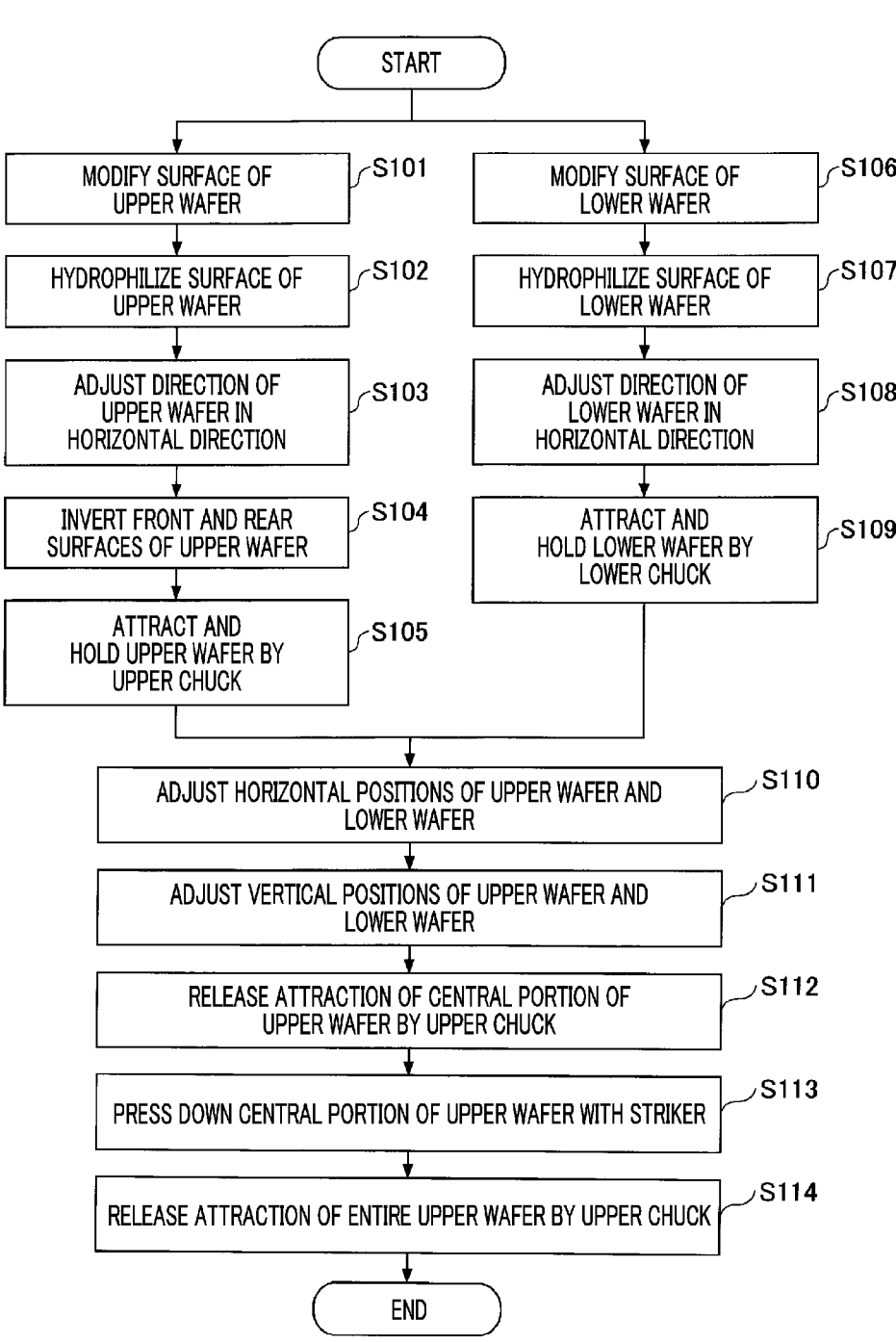
FIG. 8 is a flowchart illustrating a part of a processing performed by the bonding system according to the exemplary embodiment.

FIG. 8 is a flowchart illustrating a part of a processing performed by the bonding system according to the exemplary embodiment. Further, the various processes shown in FIG. 8 are performed under the control of the control device 70.

First, a cassette C1 accommodating a plurality of upper wafers W1, a cassette C2 accommodating a plurality of lower wafers W2 and an empty cassette C3 are placed on the preset placing plates 11 of the carry-in/out station 2. Then, an upper wafer W1 is taken out of the cassette C1 by the transfer device 22 and is transferred to the transition device 50 of the third processing block G3 of the processing station 3.

Subsequently, the upper wafer W1 is transferred into the surface modifying apparatus 30 of the first processing block G1 by the transfer device 61. In the surface modifying apparatus 30, an oxygen gas as the processing gas is formed into plasma to be ionized under the preset decompressed atmosphere. The oxygen ions are irradiated to the bonding surface W1j of the upper wafer W1, and the bonding surface W1j is plasma-processed. As a result, the bonding surface W1j of the upper wafer W1 is modified (process S101).

Then, the upper wafer W1 is transferred into the surface hydrophilizing apparatus 40 of the second processing block G2 by the transfer device 61. In the surface hydrophilizing apparatus 40, the pure water is supplied onto the upper wafer W1 while rotating the upper wafer W1 held by the spin chuck. The supplied pure water is diffused on the bonding surface W1*j* of the upper wafer W1, and hydroxyl groups (silanol groups) adhere to the bonding surface W1*j* of the upper wafer W1 modified in the surface modifying apparatus 30, so that the bonding surface W1*j* is hydrophilized (process S102). Further, the bonding surface W1*j* of the upper wafer W1 is cleaned by this pure water used to hydrophilize the bonding surface W1*j*.

Thereafter, the upper wafer W1 is transferred into the bonding apparatus 41 of the second processing block G2 by the transfer device 61. The upper wafer W1 transferred into the bonding apparatus 41 is then delivered into the position adjusting mechanism 120 via the transition 110 by the wafer transfer mechanism 111. Then, the direction of the upper wafer W1 in the horizontal direction is adjusted by the position adjusting mechanism 120 (process S103).

Subsequently, the upper wafer W1 is delivered from the position adjusting mechanism 120 onto the holding arm 131 of the inverting mechanism 130. Then, in the transfer region T1, by inverting the holding arm 131, the front surface and the rear surface of the upper wafer W1 are inverted (process S104). That is, the bonding surface W1*j* of the upper wafer W1 is turned to face down.

Afterwards, the holding arm 131 of the inverting mechanism 130 is rotated to be located under the upper chuck 140. Then, the upper wafer W1 is delivered to the upper chuck 140 from the inverting mechanism 130. The non-bonding surface Win of the upper wafer W1 is attracted to and held by the upper chuck 140 in the state that the notch of the upper wafer W1 is oriented to a predetermined direction (process S105).

While the above-described processes S101 to S105 are being performed on the upper wafer W1, a processing of the lower wafer W2 is performed. First, the lower wafer W2 is taken out of the cassette C2 by the transfer device 22 and transferred into the transition device 50 of the processing station 3 by the transfer device 22.

Thereafter, the lower wafer W2 is transferred into the surface modifying apparatus 30 by the transfer device 61, and the bonding surface W2*j* of the lower wafer W2 is modified (process S106). Further, the modification of the bonding surface W2*j* of the lower wafer W2 in the process S106 is the same as the above-stated process S101.

Then, the lower wafer W2 is transferred into the surface hydrophilizing apparatus 40 by the transfer device 61, and the bonding surface W2*j* of the lower wafer W2 is hydrophilized (process S107). Further, the bonding surface W2*j* is cleaned by the pure water used to hydrophilize the bonding surface W2*j*. The hydrophilizing of the bonding surface W2*j* of the lower wafer W2 in the process S107 is the same as the hydrophilizing of the bonding surface W1*j* of the upper wafer W1 in the above-described process S102.

Thereafter, the lower wafer W2 is transferred into the bonding apparatus 41 by the transfer device 61. The lower wafer W2 transferred into the bonding apparatus 41 is then sent into the position adjusting mechanism 120 via the transition 110 by the wafer transfer mechanism 111. Then, the direction of the lower wafer W2 in the horizontal direction is adjusted by the position adjusting mechanism 120 (process S108).

Afterwards, the lower wafer W2 is transferred onto the lower chuck 141 by the wafer transfer mechanism 111 and attracted to and held by the lower chuck 141 (process S109). At this time, the non-bonding surface W2*n* of the lower wafer W2 is attracted to and held by the lower chuck 141 in the state that the notch of the lower wafer W2 is oriented to the same direction as the notch of the upper wafer W1.

Thereafter, the position adjustment in the horizontal direction between the upper wafer W1 held by the upper chuck 140 and the lower wafer W2 held by the lower chuck 141 is performed (process S110). To elaborate, the horizontal positions (for example, including positions in the X-axis direction, the Y-axis direction and the θ direction) of the upper wafer W1 and the lower wafer W2 are adjusted such that a plurality of alignment marks formed at the bonding surface W1*j* of the upper wafer W1 and a plurality of alignment marks formed at the bonding surface W2*j* of the lower wafer W2 are respectively overlapped, when viewed in the vertical direction.

Thereafter, the position adjustment in the vertical direction between the upper wafer W1 held by the upper chuck 140 and the lower wafer W2 held by the lower chuck 141 is performed (process S111). To elaborate, the first lower chuck mover 160 moves the lower chuck 141 in the vertically upward direction, thus allowing the lower wafer W2 to approach the upper wafer W1. Accordingly, as shown in FIG. 6, a distance S between the bonding surface W2*j* of the lower wafer W2 and the bonding surface W1*j* of the upper wafer W1 is adjusted to, e.g., 50 μm to 200 μm.

Subsequently, after releasing the attracting and holding of the central portion of the upper wafer W1 by the upper chuck 140 (process S112), the push pin 191 of the striker 190 is lowered, so that the central portion of the upper wafer W1 is pressed down (process S113), as shown in FIG. 7A. If the central portion of the upper wafer W1 comes into contact with the central portion of the lower wafer W2 and the central portion of the upper wafer W1 and the central portion of the lower wafer W2 are pressed against each other with a preset force, the central portion of the upper wafer W1 and the central portion of the lower wafer W2 which are pressed against each other are begun to be bonded. Then, a bonding wave whereby the upper wafer W1 and the lower wafer W2 are gradually bonded from the central portions toward the peripheral portions thereof is generated.

Here, since the bonding surface W1*j* of the upper wafer W1 and the bonding surface W2*j* of the lower wafer W2 are modified in the processes S101 and S106, respectively, a Van der Waals force (intermolecular force) is generated between the bonding surfaces W1*j* and W2*j*, so that the bonding surfaces W1*j* and W2*j* are bonded. Further, since the bonding surface W1*j* of the upper wafer W1 and the bonding surface W2*j* of the lower wafer W2 are hydrophilized in the processes S102 and S107, respectively, hydrophilic groups between the bonding surfaces W1*j* and W2*j* are hydrogen-bonded, so that the bonding surfaces W1*j* and W2*j* are firmly bonded.

Thereafter, while pressing the central portion of the upper wafer W1 and the central portion of the lower wafer W2 with the push pin 191, the attracting and holding of the entire upper wafer W1 by the upper chuck 140 is released (process S114). Accordingly, as depicted in FIG. 7B, the entire bonding surface W1*j* of the upper wafer W1 and the entire bonding surface W2*j* of the lower wafer W2 come into contact with each other, and the upper wafer W1 and the lower wafer W2 are bonded. Thereafter, the push pin 191 is raised up to the upper chuck 140, and the attracting and holding of the lower wafer W2 by the lower chuck 141 is released.

Thereafter, the combined wafer T is transferred to the transition device 51 of the third processing block G3 by the transfer device 61, and then is transferred into the cassette C3 by the transfer device 22 of the carry-in/out station 2.

Through these processes, the series of operations of the bonding processing are completed.

<Control Over Distortion of Upper Wafer by Upper Chuck>

Figure 9:
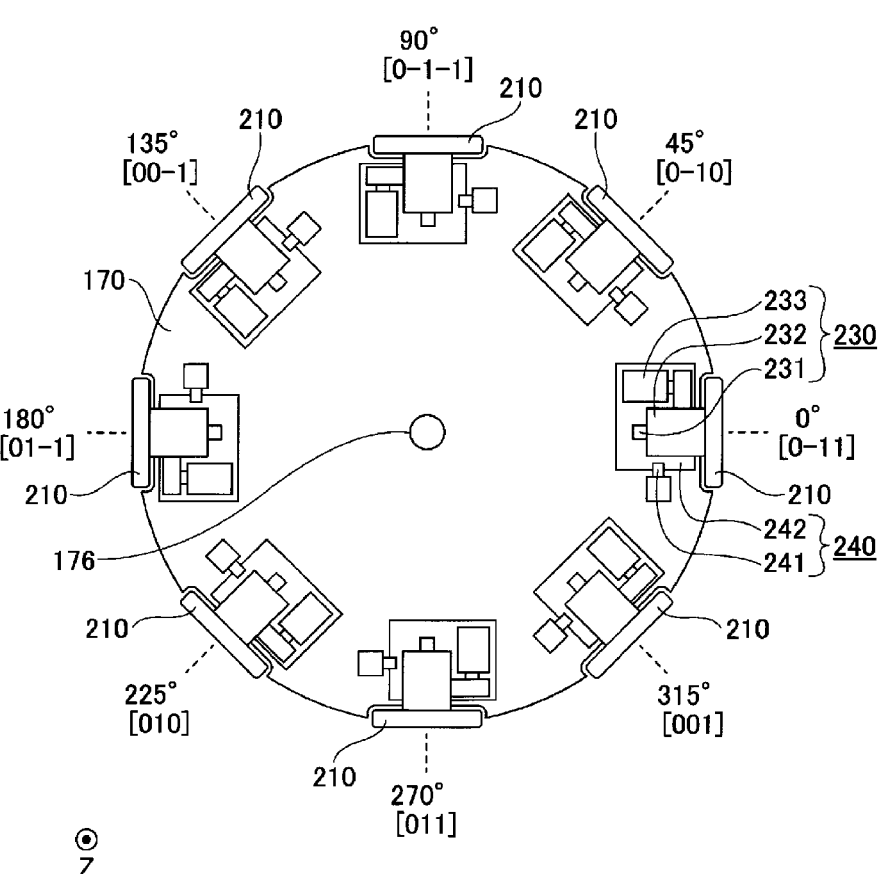
FIG. 9 is a diagram illustrating the upper chuck according to the exemplary embodiment, seen from above it.
Figure 10:
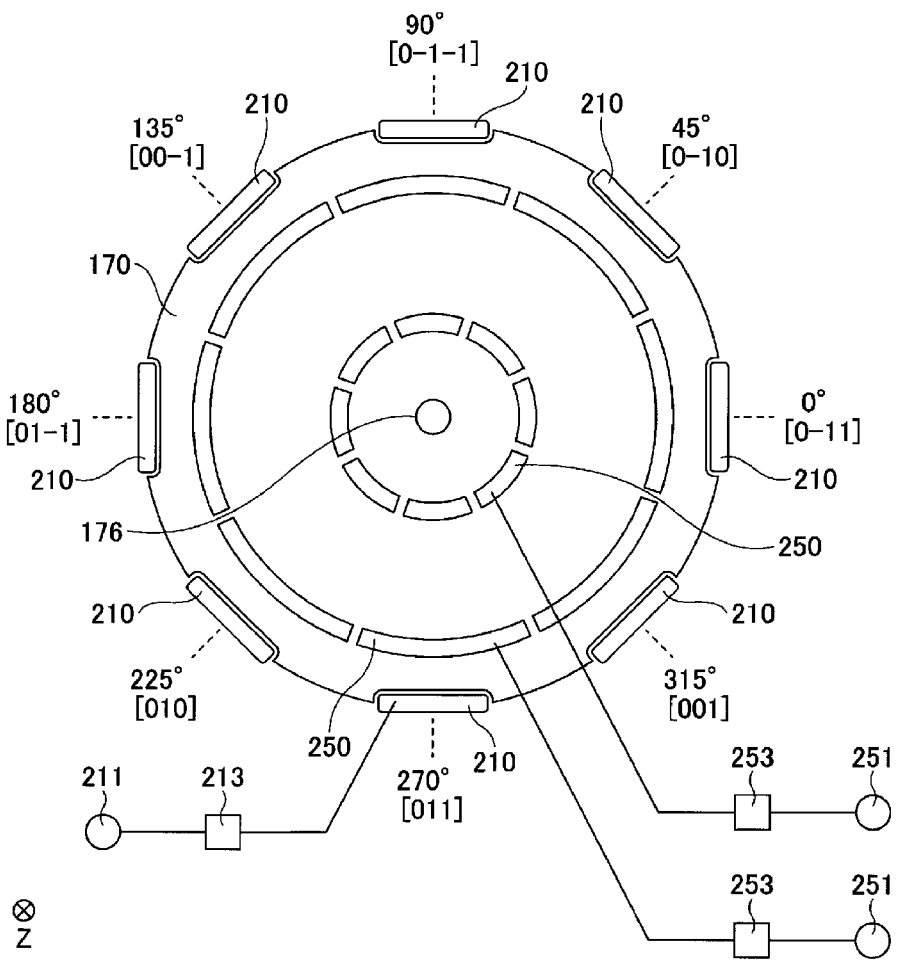
FIG. 10 is a diagram illustrating the upper chuck according to the exemplary embodiment, seen from below it.

FIG. 9 is a diagram illustrating the upper chuck according to the exemplary embodiment, seen from above it. FIG. 10 is a diagram illustrating the upper chuck according to the exemplary embodiment, seen from below it. FIG. 9 and FIG. 10 show angles in the horizontal direction on the attraction surface 140a of the upper chuck 140 (see FIG. 6 or the like) and directional indexes of the upper wafer W1 (see FIG. 6 or the like) when it is attracted to the attraction surface 140a of the upper chuck 140. Further, a plane index of the bonding surface W1j of the upper wafer W1 is (100). If a Miller index used as the directional index or the plane index is of a negative value, a sign "−" (bar) is typically put above the number. In the present exemplary embodiment, however, a minus is put before the number. Further, in FIG. 10, the pins 171 are not illustrated for the simplicity of illustration.

As illustrated in FIG. 6 or the like, the upper chuck 140 has, on the attraction surface 140a configured to attract the upper wafer W1, outer attracting members 210 configured to attract a peripheral portion of the upper wafer W1 and inner attracting members 250 configured to attract a portion of the upper wafer W1 inside the peripheral portion thereof attracted by the outer attracting members 210 in the diametrical direction. At least one of the inner attracting members 250 attracts a portion of the upper wafer W1 within 30% of the radius of the upper wafer W1 from an edge thereof. In this case, a distortion at the portion within 30% of the radius of the upper wafer W1 from the edge thereof can be controlled. Here, the inner attracting member 250 will be first elaborated, and, then, the outer attracting member 210 will be described.

The inner attracting members 250 are fixed to the chuck base 170 and protruded from the bottom surface of the chuck base 170, as shown in FIG. 6, for example. The pins 171 are scattered on and protruded from the bottom surface of the chuck base 170. The pins 171 and the inner attracting members 250 have the same height.

Each of the inner attracting member 250 is formed to have, for example, a circular arc shape, as depicted in FIG. 10. A single ring-shaped inner attracting member group is composed of eight inner attracting members 250 which are arranged at a regular distance therebetween in a circumferential direction of the attraction surface 140a. This ring-shaped inner attracting member group may be plural (for example, two) in number, and the plurality of ring-shaped inner attracting member groups may be concentrically arranged around the through hole 176. The whole of one of the two ring-shaped inner attracting member groups is disposed in a region within 30% of the radius of the upper wafer W1 from the edge thereof, and the other is disposed at a region inside it.

The bonding apparatus 41 may include, for example, a vacuum pump 251 as an attracting pressure generator configured to generate an attracting pressure (for example, a vacuum pressure) in the inner attracting member 250. The vacuum pump 251 is provide for each of the ring-shaped inner attracting member groups. These multiple (for example, two) vacuum pumps 251 are configured to generate the attracting pressures in the plurality of (for example, two) inner attracting member groups independently under the control of the control device 70.

Furthermore, the bonding apparatus 41 includes, for example, a vacuum regulator 253 as an attracting pressure adjuster configured to adjust the attracting pressure generated in the inner attracting member 250. The vacuum regulator 253 is provided for each of the ring-shaped inner attracting member groups. These multiple (for example, two) vacuum regulators 253 are configured to control the attracting pressures, which are generated in the plurality of (for example, two) inner attracting member groups, independently under the control of the control device 70.

The single vacuum pump 251 is connected to the eight inner attracting members 250 constituting the single ring-shaped inner attracting member group via pipelines which are equipped with the one vacuum regulator 253 (only one pipeline connected to the one inner attracting member 250 is illustrated in FIG. 10). If the control device 70 operates the one vacuum pump 251, the one vacuum pump 251 generates the vacuum pressure in the eight inner attracting members 250, and this vacuum pressure is maintained at a predetermined set value by the one vacuum regulator 253. As a result, the attracting pressure corresponding to the set value is generated in the eight inner attracting members 250. The set value by the vacuum regulator 253 can be varied by the control device 70. Meanwhile, if the control device 70 stops the operation of the one vacuum pump 251, the eight inner attracting members 250 are returned back to an atmospheric pressure, so that the generation of the attracting pressure in the eight inner attracting members 250 is released.

Here, the number and the layout of the vacuum pumps 251 and the number and the layout of the vacuum regulators 253 are not particularly limited. The vacuum pump 251 and the vacuum regulator 253 need to be provided respectively in regions in which the attracting pressure is controlled independently. By way of example, among the eight inner attracting members 250 constituting the single ring-shaped inner attracting member group, four inner attracting members 250 arranged in 0°-base-90°-cycle directions to be described later and the other four inner attracting members 250 arranged in 45°-base-90°-cycle directions to be described later may be connected to different vacuum pumps 251 via different vacuum regulators 253, respectively.

The outer attracting member 210 is configured to be movable with respect to the chuck base 170. The outer attracting member 210 may be plural (for example, eight) in number, and the plurality of outer attracting members 210 may be arranged at a regular distance therebetween in the circumferential direction of the attraction surface 140a. The eight outer attracting members 210 constitute a single ring-shaped outer attracting member group. Further, though the number of the outer attracting members 210 is eight in this exemplary embodiment, the number of the outer attracting members 210 may be one or more without being particularly limited.

The bonding apparatus 41 may include, for example, a vacuum pump 211 as an attracting pressure generator configured to generate an attracting pressure (for example, a vacuum pressure) in the outer attracting members 210. This one vacuum pump 211 is configured to generate the attracting pressure in the eight outer attracting members 210 under the control of the control device 70. Furthermore, the bonding apparatus 41 includes, for example, a vacuum regulator 213 as an attracting pressure adjuster configured to adjust the attracting pressure generated by the attracting pressure generator. This one vacuum regulator 213 is configured to control the attracting pressure generated in the eight outer attracting members 210 under the control of the control device 70.

The single vacuum pump 211 is connected to the eight outer attracting members 210 via pipelines which are equipped with the one vacuum regulator 213 (only one pipeline connected to the one outer attracting member 210 is illustrated in FIG. 10). If the control device 70 operates the one vacuum pump 211, the one vacuum pump 211 generates the vacuum pressure in the eight outer attracting members 210, and this vacuum pressure is maintained at a predetermined set value by the one vacuum regulator 213. As a result, the attracting pressure corresponding to the set value is generated in the eight outer attracting members 210. The set value by the vacuum regulator 213 can be varied by the control device 70. Meanwhile, if the control device 70 stops the operation of the one vacuum pump 211, the eight outer attracting members 210 are returned back to the atmospheric pressure, so that the generation of the attracting pressure in the eight outer attracting members 210 is stopped.

Here, the number and the layout of the vacuum pumps 211 and the number and the layout of the vacuum regulators 213 are not particularly limited. The vacuum pump 211 and the vacuum regulator 213 need to be provided respectively in regions in which the attracting pressure is controlled independently. By way of example, among the eight outer attracting members 210 constituting the single ring-shaped outer attracting member group, four outer attracting members 210 arranged in the 0°-base-90°—cycle directions to be described later and the other four outer attracting members 210 arranged in the 45°-base-90°-cycle directions to be described later may be connected to different vacuum pumps 211 via different vacuum regulators 213, respectively.

The bonding apparatus 41 is equipped with a moving device 220 configured to move the outer attracting members 210 with respect to the inner attracting members 250 (see FIG. 6 and FIG. 7A and FIG. 7B). Each of the moving devices 220 moves the outer attracting member 210 with respect to the inner attracting member 250 under the control of the control device 70.

The moving device 220 includes a diametrical moving unit 230 configured to move the outer attracting member 210 with respect to the inner attracting member 250 in the diametrical direction of the attraction surface 140a, for example. The moving device 220 may include a plurality of (for example, eight) diametrical moving units 230, and the plurality of diametrical moving units 230 move the plurality of (for example, eight) outer attracting members 210 in the diametrical direction independently.

Each of the diametrical moving units 230 is equipped with a diametrical guide 231 extending in the diametrical direction of the attraction surface 140a; a diametrical slider 232 configured to be moved along the diametrical guide 231; and an actuator 233 configured to move the diametrical slider 232 along the diametrical guide 231. The diametrical guide 231 is fixed to, for example, a vertical slider 242 to be described later. The diametrical slider 232 holds the outer attracting member 210, and the outer attracting member 210 is moved along with the diametrical slider 232.

The actuator 233 moves the diametrical slider 232 along the diametrical guide 231 under the control of the control device 70. Though the actuator 233 is not particularly limited, a piezo actuator having a high resolution power may be used, for example. The piezo actuator includes a piezo element configured to be extended or contracted in response to an application voltage.

The moving device 220 has the vertical moving unit 240 configured to move the outer attracting member 210 with respect to the inner attracting member 250 in a vertical direction (for example, the Z-axis direction) perpendicular to the attraction surface 140a. The moving device 220 may have a plurality of (for example, eight) vertical moving units 240, and the plurality of vertical moving units 240 move the plurality of (for example, eight) outer attracting members 210 in the vertical direction independently.

Each of the vertical moving units 240 is equipped with a vertical guide 241 (see FIG. 9) extending in the Z-axis direction; the vertical slider 242 configured to be moved along the vertical guide 241; and an actuator 243 (see FIG. 6 and FIG. 7A and FIG. 7B) configured to move the vertical slider 242 along the vertical guide 241. The vertical guide 241 is fixed to, for example, the chuck base 170. The vertical slider 242 holds the outer attracting member 210 with the diametrical moving unit 230 therebetween, and the outer attracting member 210 is moved along with the vertical slider 242.

The actuator 243 moves the vertical slider 242 along the vertical guide 241 under the control of the controller 70. Though the actuator 243 is not particularly limited, a piezo actuator having a high resolution power may be used, for example. The piezo actuator includes a piezo element configured to be extended or contracted in response to an application voltage.

Furthermore, the arrangement of the diametrical moving unit 230 and the vertical moving unit 240 may be reversed. To be specific, the diametrical guide 231 may be fixed to the chuck base 170, and the vertical guide 241 may be fixed to the diametrical slider 232.

The bonding apparatus 41 includes the control device 70 configured to control a distortion of the upper wafer W1 attracted to the attraction surface 140a by controlling the movement of the outer attracting member 210 with respect to the inner attracting member 250. Though the control device 70 is provided at an outside of the bonding apparatus 41 in FIG. 1 or the like, the control device 70 may be configured as a part of the bonding apparatus 41. The control device 70 corresponds to a controller described in the claims.

The control device 70 moves the outer attracting member 210, which is attracting the peripheral portion of the upper wafer W1, with respect to the inner attracting member 250 while a bonding wave whereby the upper wafer W1 and the lower wafer W2 are gradually bonded from the central portions toward the peripheral portions thereof is being generated. At this time, the inner attracting member 250 may not be attracting the upper wafer W1, unlike the outer attracting member 210. Since the bonding of the central portion of the upper wafer W1 and the central portion of the lower wafer W2 has been completed, the upper wafer W1 may suffer the distortion which is caused by the displacement of the outer attracting members 210 with respect to the inner attracting member 250 with a lapse of time even if the inner attracting members 250 is not attracting the upper wafer W1.

By way of example, the control device 70 controls the distortion of the upper wafer W1 by controlling the movement of the outer attracting member 210 in the diametrical direction. Accordingly, a stress of the upper wafer W1 in the diametrical direction can be controlled. While the bonding wave is being generated, the control device 70 may change a moving direction of the outer attracting member 210 between a diametrically inward direction and a diametrically outward direction.

Furthermore, the control device 70 controls the distortion of the upper wafer W1 by controlling the movement of the outer attracting member 210 in the vertical direction. Accordingly, a stress of the upper wafer W1 in the vertical direction can be controlled. While the bonding wave is being generated, the control device 70 may change the moving direction of the outer attracting member 210 between a vertically downward direction and a vertically upward direction.

Moreover, the control device 70 may move the outer attracting member 210 in the vertically downward direction as the bonding wave progresses. Since the peripheral portion of the upper wafer W1 can be attracted by the outer attracting member 210 until immediately before the bonding wave is ended, a time during which the distortion of the upper wafer W1 can be controlled is lengthened.

The control device 70 may move the outer attracting member 210 both in the diametrical direction and in the vertical direction, or either in the diametrical direction or in the vertical direction.

Besides, in the present exemplary embodiment, the control device 70 controls the distortion caused at the upper wafer W1 while the bonding wave is being generated. However, the distortion caused at the upper wafer W1 before the generation of the bonding wave may be controlled. To elaborate, the control device 70 may move the outer attracting member 210 attracting the peripheral portion of the upper wafer W1 with respect to the inner attracting member 250 when the entire upper wafer W1 and the entire lower wafer W2 are spaced apart from each other, as illustrated in FIG. 6 or the like. At this time, like the outer attracting member 210, the inner attracting member 250 is attracting the portion of the upper wafer W1 inside the peripheral portion thereof in the diametrical direction. The upper wafer W1 suffers the distortion caused by the displacement of the outer attracting member 210.

According to the exemplary embodiment, by controlling the movement of the outer attracting member 210 with respect to the inner attracting member 250, the distortion of the upper wafer W1 is controlled. Here, the movement of the outer attracting member 210 with respect to the inner attracting member 250 is performed based on a setting on the movement. The setting on the movement includes settings such as, by way of non-limiting example, a moving direction, a moving speed, a moving start time, a moving end time, and so forth. The setting on the movement is read out from the recording medium in which the settings are previously stored. According to the present exemplary embodiment, since the upper wafer W1 and the lower wafer W2 are bonded while controlling the distortion of the upper wafer W1, an attachment distortion between the upper wafer W1 and the lower wafer W2 can be reduced.

The attachment distortion is represented by a magnitude of a position deviation left when the upper wafer W1 and the lower wafer W2 are moved relatively in parallel to each other, moved by being rotated and expanded/contracted analogously such that the position deviation between the alignment marks of the upper wafer W1 and the alignment marks of the lower wafer W2 when viewed from the top is minimized, for example. The changing of the setting on the movement of the outer attracting member 210, the bonding performed according to the changed setting and the measuring of the attachment distortion after the bonding may be performed repeatedly until the attachment distortion falls comes into a tolerance range. The changing of the setting on the movement of the outer attracting member 210 may be performed based on multiple data obtained previously. The data is not particularly limited as long as it indicates a relationship between the settings (or record) on the movement of the outer attracting member 210 and the attachment distortion, and the data may be stored in the information recording medium and read out to be used.

Through repeated researches, the present inventors have found out that one reason for the attachment distortion may be found from anisotropy of a physical property of the upper wafer W1 such as Young's modulus. The physical property such as Young's modulus of the upper wafer W1 varies in the circumferential direction periodically. The attachment distortion caused by this variation becomes conspicuous as it goes outwards from the inner side of the upper wafer W1 in the diametrical direction. It is because a distance between, for example, a [0-11] direction and a [001] direction in the circumferential direction increases as it goes outwards from the inner side of the upper wafer W1 in the diametrical direction.

As a resolution, the control device 70 according to the present exemplary embodiment controls the distortion of the upper wafer W1 by controlling the movements of at least two (in the present exemplary embodiment, eight) outer attracting members 210 in the diametrical direction. The setting may be made based on anisotropy of a physical property such as Young's modulus of the upper wafer W1. The setting on the movement is different between at least one outer attracting member 210 and another outer attracting member 210. To elaborate, a setting of at least one selected from the moving direction (which is distinguished between the diametrically inward direction and the diametrically outward direction), the moving speed, the moving start time and the moving end time is different.

The control device 70 according to the present exemplary embodiment controls the distortion of the upper wafer W1 by controlling the movements of at least two (in the present exemplary embodiment, eight) outer attracting members 210 in the vertical direction. The setting may be decided based on the anisotropy of the physical property such as Young's modulus of the upper wafer W1. The setting on the movement is different between at least one outer attracting member 210 and another outer attracting member 210. To elaborate, a setting of at least one selected from the moving direction (which is distinguished between the vertically upward direction and the vertically downward direction), the moving speed, the moving start time and the moving end time is different.

A Young's modulus, a Poisson's ratio and a shear modulus of a single crystalline silicon wafer varies at a cycle of 90°. Directions (a direction of 0°, a direction of 90°, a direction of 180°, and a direction of 270°) at the cycle of 90° with respect to a [0-11] direction (direction of 0°) are referred to as "0°-base-90°-cycle direction" together. Further, directions (a direction of 45°, a direction of 135°, a direction of 225°, and a direction of) 315° at the cycle of 90° with respect to a [0-10] direction (direction of 45°) are referred to as "45°-base-90°-cycle direction" together. The Young's modulus of the single crystalline silicon wafer is highest at the 0°-base-90°-cycle direction and the lowest at the 45°—base-90°-cycle direction. Further, the Poisson's ratio and the shear modulus are highest at the 45°-base-90°-cycle direction and the lowest at the 0°-base-90°-cycle direction.

Thus, in case that upper wafer W1 is a single crystalline silicon wafer, the outer attracting members 210 may be arranged in the 0°-base-90°-cycle directions and in the 45°-base-90°-cycle directions, as illustrated in FIG. 9 and FIG. 10. The setting can be made based on a variation of the physical property of the single crystalline silicon wafer at the cycle of 90°. The settings on the movement of at least one of the four outer attracting members 210 disposed in the 0°-base-90°-cycle directions and at least one of the four attracting members 210 disposed in the 45°-base-90°-cycle directions are different.

Here, the setting on the movement being different implies that at least one of the setting on the movement in the diametrical direction and the setting on the movement in the vertical direction is different. By way of example, in case that the eight outer attracting members 210 are moved in the vertically downward direction as the bonding wave progresses as stated above, the setting on the movement in the vertical direction may be same between the eight outer attracting members 210. In this case, the setting on the movement in the diametrical direction needs to be different between at least one outer attracting member 210 and another outer attracting member 210.

Meanwhile, for the four outer attracting members 210 disposed in the 0°-base-90°-cycle directions, the setting on the movement may be same or different. Further, for the four outer attracting members 210 disposed in the 45°-base-90°-cycle directions, the setting on the movement may be same or different.

In addition, though the eight outer attracting members 210 are used in FIG. 9 and FIG. 10, the number of the outer attracting members 210 is not particularly limited, as already mentioned above. By way of example, more than eight outer attracting members may be used, and an additional outer attracting member 210 may be disposed between the 0°-base-90°-cycle directions and the 45°-base-90°-cycle directions.

<Modification Examples and Improvements>

So far, the exemplary embodiment of the substrate processing apparatus and the substrate processing method have been described. However, the present disclosure is not limited to the above-described exemplary embodiment or the like. Various changes, corrections, replacements, addition, deletion and combinations may be made within the scope of the claims, and all of these are included in the scope of the inventive concept of the present disclosure.

Figure 11:
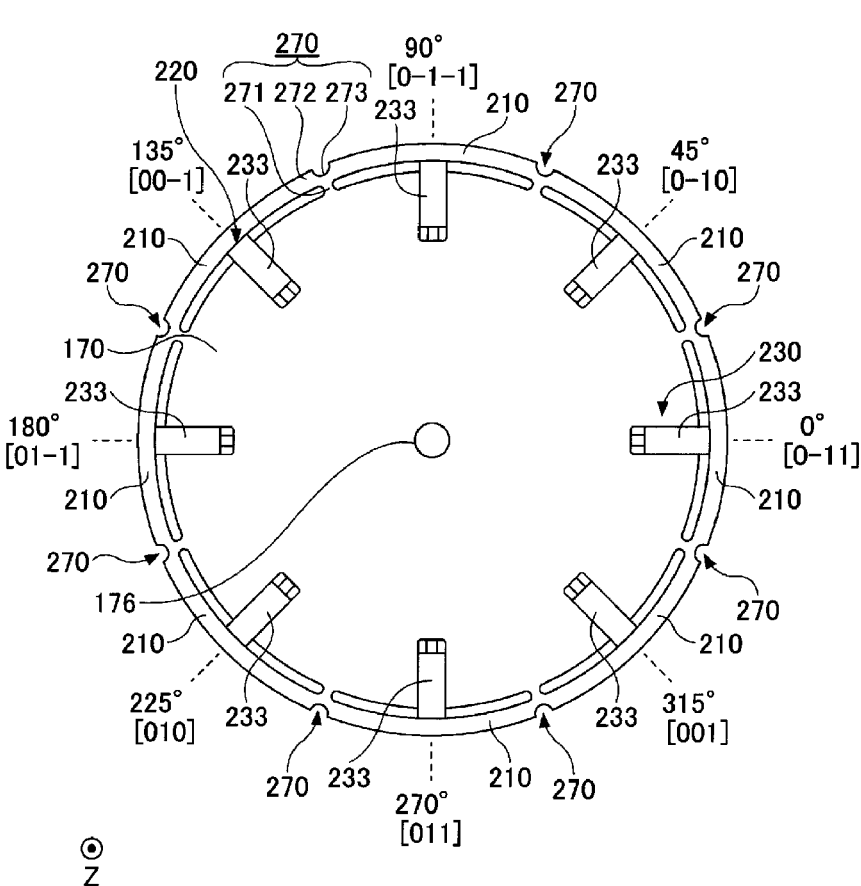
FIG. 11 is a diagram illustrating an upper chuck according to a modification example, seen from above it.
Figure 12:
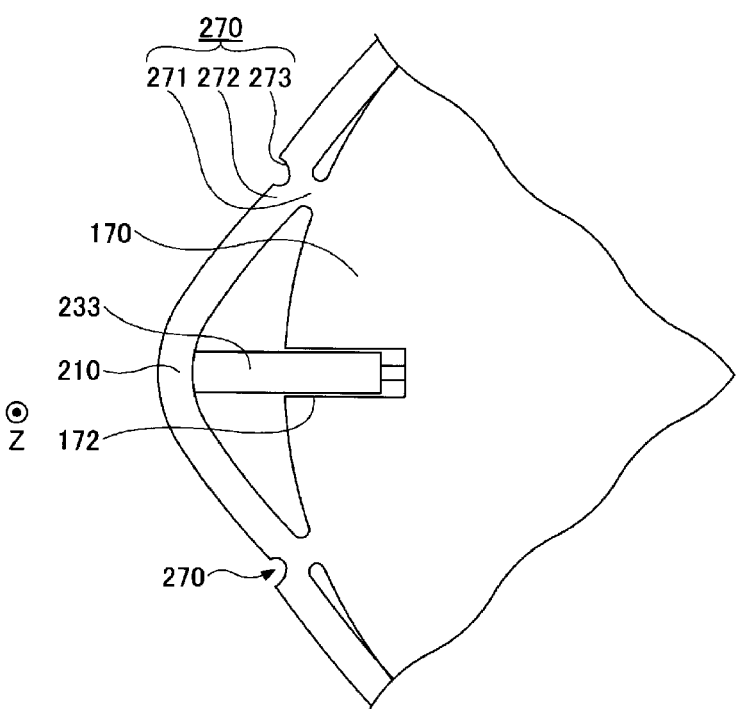
FIG. 12 is a diagram exaggeratingly illustrating an elastic deformation of an elastic hinge according to the modification example.

FIG. 11 is a diagram illustrating an upper chuck according to a modification example, seen from above it. FIG. 12 is a diagram showing an elastic deformation of an elastic hinge according to the modification example, and the elastic deformation is illustrated in an exaggerated manner for the convenience of demonstration. Below, the description will mainly focus on distinctive features from the above-described exemplary embodiment.

In the upper chuck 140 according to the modification example, the chuck base 170, the outer attracting member 210 and the inner attracting member 250 (see FIG. 10) are made of the same material and processed from a single member. Since the outer attracting member 210 and the inner attracting member 250 are configured as a single body, an attraction surface of the outer attracting member 210 and an attraction surface of the inner attraction member 250 can be processed as a single surface accurately.

The upper chuck 140 according to the present modification example is equipped with, as illustrated in FIG. 11 and FIG. 12, elastic hinges 270 configured to connect the outer attracting members 210 to the chuck base 170 such that the outer attracting members 210 are movable. The elastic hinges 270 are made of the same material as the chuck base 170 and the outer attracting members 210 and processed from a single member. Eight circular arc-shaped slits are formed between the chuck base 170 and the outer attracting members 210, and the elastic hinges 270 are disposed between every two adjacent slits. The elastic hinges 270 connect the chuck base 170 and the outer attracting members 210 continuously.

Each of the elastic hinges 270 is formed to have a T-shape when viewed from a direction perpendicular to the attraction surface 140a, as depicted in FIG. 11, for example. The elastic hinge 270 has a protruding portion 271 protruded from an edge of the chuck base 170 in the diametrically outward direction; and a circular arc-shaped portion 272 extending from an end of the protruding portion 271 in both directions (a clockwise direction and a counterclockwise direction) in the circumferential direction.

The circular arc-shaped portion 272 is formed to be continuous with the outer attracting member 210 to be disposed on the same circle as the outer attracting member 210. A notch 273 is formed at an outer peripheral surface of the circular arc-shaped portion 272. The notch 273 is formed at a position corresponding to an extension of the protruding portion 271 in the diametrically outward direction. As the circular arc-shaped portion 272 and the like are elastically deformed around the notch 273, the outer attracting member 210 is moved in the diametrical direction with respect to the chuck base 170.

The moving device 220 is equipped with the diametrical moving units 230 each configured to move the outer attracting member 210 with respect to the inner attracting member 250 in the diametrical direction. The plurality of (for example, eight) diametrical moving units 230 move the plurality of (for example, eight) outer attracting members 210 in the diametrical direction independently. Each diametrical moving unit 230 has the actuator 233. The actuator 233 is disposed within a groove 172 (see FIG. 12) formed at the top surface of the chuck base 170, for example. The groove 172 extends from the outer peripheral surface of the chuck base 170 in the diametrically inward direction.

An end portion of the actuator 233 at an outer side in the diametrical direction is in contact with an inner peripheral surface of the outer attracting member 210, and an end portion of the actuator 233 at an inner side in the diametrical direction is in contact with a wall surface of the groove 172 formed at the chuck base 170. The actuator 233 is extended or contracted under the control of the control device 70. If the actuator 233 is extended as shown in FIG. 12, the outer attracting member 210 is moved in the diametrically outward direction. Then, if the actuator 233 is contracted, the outer attracting member 210 is moved in the diametrically inward direction.

Though the actuator 233 is not particularly limited, a piezo actuator having a high resolution power may be used, for example. The piezo actuator includes a piezo element configured to be extended or contracted in response to an application voltage.

Furthermore, the elastic hinge 270 according to the modification example serves to connect the outer attracting member 210 to the chuck base 170 such that the outer attracting member 210 is movable in the diametrical direction. However, the elastic hinge 270 may connect the outer attracting member 210 to the chuck base 17 such that the outer attracting member 210 is movable in the vertical direction, or movable in both the diametrical direction and the vertical direction.

The upper chuck 140 according to the above-described exemplary embodiment and the modification example is configured to vacuum-attract the lower wafer W1. However, the upper chuck 140 may be configured to attract the upper wafer W1 electrostatically. In this case, the attracting pressure generator includes, for example, an internal electrode embedded in the upper electrode 140. Meanwhile, the attracting pressure adjuster includes, for example, a power adjuster configured to adjust a power to be supplied to the internal electrode. The power adjuster may be a step-down DC/DC converter, a step-up DC/DC converter, or the like.

In the above-described exemplary embodiment and the modification example, the distortion caused at the upper wafer W1 attracted to the upper chuck 140 is controlled. However, the distortion caused at the lower wafer W2 attracted to the lower chuck 141 may be controlled. That is, the inventive concept of the present disclosure may be applied to the lower chuck 141, and, in this case, the lower chuck 141 may correspond to the holder described in the claims and the upper chuck 140 corresponds to the facing holder described in the claims. Further, the inventive concept of the present disclosure may be applied to both the upper chuck 140 and the lower chuck 141. Furthermore, the inventive concept of the present disclosure may be also applied to an apparatus other than the bonding apparatus 41, for example, a dicing apparatus or the like. The inventive concept of the present disclosure may be applied to any of various apparatuses as long as they have a holder configured to hold the substrate.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, applicants hereby rescind and retract such disclaimer. Accordingly, the references previously presented in the parent applications may need to be revisited.

According to the exemplary embodiments, it is possible to control distortion of the substrate which is attracted to the attraction surface.

We claim:

1. A substrate processing apparatus, comprising:
   a holder having thereon a circular attraction surface configured to attract a substrate and including an outer attracting member configured to attract a peripheral portion of the substrate and an inner attracting member configured to attract a portion of the substrate inside the peripheral portion of the substrate attracted by the outer attracting member in a diametrical direction of the circular attraction surface;
   a moving device configured to move the outer attracting member with respect to the inner attracting member; and a controller configured to control a distortion, which is caused at the substrate attracted to the circular attraction surface, by controlling a movement of the outer attracting member with respect to the inner attracting member,
   wherein the moving device comprises a vertical moving unit configured to move the outer attracting member with respect to the inner attracting member in a vertical direction perpendicular to the circular attraction surface, and
   the controller is further configured to control the distortion of the substrate attracted to the circular attraction surface by controlling a movement of the outer attracting member in the vertical direction.

2. The substrate processing apparatus of claim 1,
   wherein the outer attracting member includes multiple outer attracting members, and the multiple outer attracting members are arranged at a regular distance therebetween in a circumferential direction, and
   the controller is configured to control the distortion of the substrate attracted to the circular attraction surface by independently controlling the movement of at least two members from among the multiple outer attracting members in the vertical direction.

3. The substrate processing apparatus of claim 2,
   wherein the controller is configured to independently control the movement of the multiple outer attracting members by setting at least one of a moving direction, a moving speed, a moving start time and a moving end time to be different between at least one outer attracting member and another outer attracting member.

4. The substrate processing apparatus of claim 3,
   wherein the controller is configured to independently control the movement of the multiple outer attracting members based on pre-stored data in a memory regarding an anisotropy in a physical property of Young's modulus of the substrate.

5. The substrate processing apparatus of claim 1, further comprising:
   a facing holder disposed to face the holder,
   wherein the facing holder is configured to hold another substrate to be bonded to the substrate.

6. The substrate processing apparatus of claim 5,
   wherein the holder comprises a striker configured to press the substrate held by the holder into the another substrate held by the facing holder.

* * * * *